US006553084B1

United States Patent
Maru

(10) Patent No.: US 6,553,084 B1
(45) Date of Patent: Apr. 22, 2003

(54) DIGITAL AUTOMATIC GAIN CONTROL LINEARIZER AND DIGITAL AUTOMATIC GAIN CONTROL CIRCUIT USING THE SAME

(75) Inventor: Tsuguo Maru, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/327,260

(22) Filed: Jun. 7, 1999

(30) Foreign Application Priority Data

Jun. 10, 1998 (JP) .......................................... 10-161226

(51) Int. Cl.⁷ ............................................. H04L 27/08
(52) U.S. Cl. .................... 375/345; 455/200.1; 455/219; 455/240.1; 455/245.1; 455/250.1; 330/254; 330/278
(58) Field of Search ................................. 375/130, 135, 375/136, 141, 146, 147, 345, 316, 324, 340; 455/194.2, 200.1, 226.2, 232.1, 234.1, 245.1, 247.1, 250.1; 330/129, 131, 254, 256, 278, 284

(56) References Cited

U.S. PATENT DOCUMENTS

| | | | |
|---|---|---|---|
| 4,566,076 A | | 1/1986 | Van Der Steen |
| 5,469,115 A | * | 11/1995 | Peterzell et al. ............. 330/129 |
| 5,566,201 A | * | 10/1996 | Ostman ....................... 370/342 |
| 5,603,113 A | * | 2/1997 | De Loe, Jr. .................. 330/129 |
| 5,627,857 A | * | 5/1997 | Wilson ....................... 375/219 |
| 5,737,033 A | * | 4/1998 | Masuda ....................... 330/129 |
| 6,107,878 A | * | 8/2000 | Black ......................... 330/129 |
| 6,181,201 B1 | * | 1/2001 | Black ......................... 330/129 |

FOREIGN PATENT DOCUMENTS

| JP | 7-20034 | 3/1995 |
|---|---|---|
| JP | 8-293748 | 11/1996 |

OTHER PUBLICATIONS

U.K. Office Action issued Sep. 20, 1999 in connection with a related application.

* cited by examiner

Primary Examiner—Stephen Chin
Assistant Examiner—Dac V. Ha
(74) Attorney, Agent, or Firm—Dickstein, Shapiro, Morin & Oshinsky LLP

(57) ABSTRACT

A digital automatic gain control linearizer for controlling a variable gain control element for automatically controlling gain, using an analog signal obtained by converting input digital data includes a memory an average calculation unit. The memory outputs upper and lower limit data corresponding respectively to the upper and lower limits of a binary data range which can be expressed by a plurality of upper bits forming the digital data. The average calculation unit calculates the average of one and other data of the upper and lower limit data, and repeats average calculation a predetermined number of times using the calculated average at least one of the upper limit data and the lower limit data. Average calculation is repeated a number of times corresponding to the lower-bit value of the digital data except for the plurality of upper bits, and the variable gain control element is controlled in accordance with the average calculated by the average calculation unit.

33 Claims, 6 Drawing Sheets

DIGITAL AUTOMATIC GAIN CONTROL LINEARIZER AND DIGITAL AUTOMATIC GAIN CONTROL CIRCUIT USING THE SAME

BACKGROUND OF THE INVENTION

1. Field of the Invention

The present invention relates to a digital automatic gain control (to be simply referred to as AGC hereinafter) linearizer for performing digital automatic gain control with high linearity in mobile communications and, more particularly, to a digital AGC linearizer having a predistortion function even with a low-linearity, low-cost AGC element.

2. Description of the Prior Art

Modulation/demodulation techniques used in mobile communication systems include FDMA (Frequency Division Multiple Access), TDMA (Time Division Multiple Access), and CDMA (Code Division Multiple Access). Any system performs power control for an uplink signal to suppress energy radiation inside or outside a cell or outside an assigned channel to an allowable value or less, thereby maximizing the system capacity. However, particularly in the CDMA system, power control greatly influences the system capacity, so power control must be done carefully in order to maximize the system performance.

In general, a mobile communication terminal which receives a digitally modulated signal has a variable gain element having a gain adjusted by a control signal. Adjusting the gain in accordance with the level of the received signal is called AGC. In digital mobile communications, AGC (Auto Gain Control) is done by detecting the power of an output from the variable gain element.

The detected value is generally compared with a reference value as desired power to generate an error signal. The error signal is used to control the variable gain element to obtain the desired power.

To optimize the SN ratio in digital demodulation, the linearity of an AGC amplifier must be kept substantially over the dynamic range of an analog-to-digital converter (to be referred to as ADC) in the baseband. This means that the AGC amplifier must be able to operate over the whole dynamic range.

On the other hand, the transmit AGC in CDMA includes open-loop power control and closed-loop power control based on a command from the base station. A transmit AGC amplifier is connected to the power amplifier input of a mobile terminal, whose power amplifier output is connected to an antenna duplexer.

In the reception section, a signal received by the antenna is input to a low noise amplifier (to be referred to as LNA) via the antenna duplexer, and the signal amplified by the LNA is input to a receive AGC element. In this way, the AGC element is controlled by the power of the received signal, and an output from the AGC element is sent to the baseband and demodulated into a digital signal.

In the CDMA mobile terminal, the transmission power is determined on the basis of estimation at only the terminal in open-loop control, and on the basis of a command from the connected base station in closed-loop control. In open-loop estimation at only the terminal, the strength of the signal received from the base station is detected, uplink and downlink radio channels are regarded to be in the same state, and both the receive and transmit AGCs are kept at desired operation points by the same controlled variable.

In an actual mobile terminal, however, since the AGC has a wide operation range of 80 dB to 90 dB, the linearity, in dB conversion is lost to generate an error. As a result, an error occurs in the transmission power level in open-loop control. The gain varies depending on the temperature and frequency characteristics of the variable gain element constituting the AGC, and variations between the transmission and receive AGCs cause an error in power controllability.

Further, an AGC amplifier suitable for cost reduction uses a low-quality, low-linearity variable gain element. Considering reduction in power consumption, a low-power-consumption AGC amplifier also exhibits the same trend. For these reasons, demands have arisen for an AGC amplifier having high linearity.

Also, in integrating the AGC circuit, the circuit area must be minimized as much as possible. However, area reduction is limited in AGC circuits, for example, as disclosed in Japanese Examined Patent Publication No. 7-20034 and Japanese Unexamined Patent Publication No. 8-293748.

SUMMARY OF THE INVENTION

The present invention has been made to solve the conventional drawbacks, and has as its object to provide a digital automatic gain control linearizer which has high-precision linearity over a wide dynamic range and can be easily integrated, and a digital automatic gain control circuit using the same in auto gain control adopted in the radio field such as CDMA mobile terminals.

To achieve the above object, according to the main aspect of the present invention, there is provided a digital automatic gain control linearizer for controlling a variable gain control element for automatically controlling a gain, using an analog signal obtained by converting input digital data, comprising a memory for outputting upper and lower limit data respectively corresponding to upper and lower limits of a binary data range which can be expressed by a plurality of upper bits forming the digital data, and average calculation means for calculating an average of one and other data of the upper and lower limit data, and repeating average calculation a predetermined number of times using the calculated average as the other data, wherein average calculation by the average calculation means is repeated a number of times corresponding to a lower-bit value of the digital data except for the plurality of upper bits, and the variable gain control element is controlled in accordance with the average calculated by the average calculation means.

To achieve the above object, according to the secondary aspect of the present invention, there is provided a digital automatic gain control circuit comprising an automatic gain control loop including a variable gain control element having a reception gain controlled by the digital automatic gain control linearizer defined in the main aspect.

To achieve the above object, according to another secondary aspect of the present invention, there is provided a digital automatic gain control circuit comprising an automatic gain control loop including a variable gain control element having a transmission gain controlled by the digital automatic gain control linearizer defined in the main aspect.

An object of the present invention is to obtain linearity of an AGC amplifier in a mobile communication terminal having transmission and receive AGCs. The transmit AGC is connected to a power amplifier, whereas the receive AGC receives a signal proportional to the strength of the received signal. A received signal strength detection circuit (to be referred to as an RSSI) is connected to the receive AGC to generate digital RSSI information.

The RSSI signal is integrated by an integrator, and the integral result is used as a control signal for the digital AGC amplifier. If the linearity is maintained, the control signal level is proportional to the gain of the receive AGC amplifier for maintaining desired reception power in dB. The receive AGC linearizer is connected to the integrator, and generates a linear digital AGC control signal to compensate for nonlinearity of the variable gain element of the AGC amplifier.

The output of the receive AGC linearizer is connected to a digital-to-analog converter (to be referred to as a DAC). The DAC converts a receive AGC control signal into an analog control signal, which is input to the variable gain element of the receive AGC to control the gain of the AGC amplifier.

Similar to the receive AGC linearizer, the transmit AGC linearizer is connected to an RSSI integrator, and generates a linear transmit AGC control signal from an output from the integrator in order to compensate for nonlinearity of the transmission amplifier. The output of the transmit AGC linearizer is also connected to a DAC. This DAC for the transmit AGC converts a transmit AGC control signal into an analog control signal to control the gain of the variable gain element of the transmit AGC.

The digital AGC linearizer of the present invention is adopted in a mobile communication terminal having transmission and receive AGCs. The mobile communication terminal has a means for detecting the received digital signal.

The digital AGC linearizer of the receive AGC has a plurality of values representing reception characteristics, and a receive AGC control signal is generated from an output from the digital AGC linearizer. The reception digital AGC linearizer selects two of the values based on the detection output of the received signal, and determines an output from the digital AGC linearizer based on the detection output and selected two values.

The transmission digital AGC linearizer of the transmit AGC has a plurality of values representing transmission characteristics, and a transmit AGC control signal is generated from an output from the transmission digital AGC linearizer. The transmission digital AGC linearizer selects two of the values based on a terminal-side transmission power control signal included in a received signal, and determines an output from the transmission digital AGC linearizer based on the transmission power control signal and selected two values.

Outputs from the respective AGC linearizers are input to AD converters where the digital control signals are converted into analog control signals. The converted analog control signals control the gains of the receive and transmit AGCs.

Note that the ambient temperature may be detected to add this temperature condition as a parameter.

As is apparent from the above aspects, since the present invention employs a linearizer for calculating the middle point by sequential processing using only a simple adder and shift circuit, a digital automatic gain control circuit can be realized with a simple circuit arrangement without increasing the chip area upon integration and using any multiplier which increases current consumption.

The above and other advantages, features and additional objects of the present invention will become manifest to those versed in the art upon making reference to the following detailed description and accompanying drawings in which preferred embodiments incorporating the principle of the present invention are shown by way of illustrative examples.

DETAILED DESCRIPTION OF PREFERRED EMBODIMENTS

Figure 1:
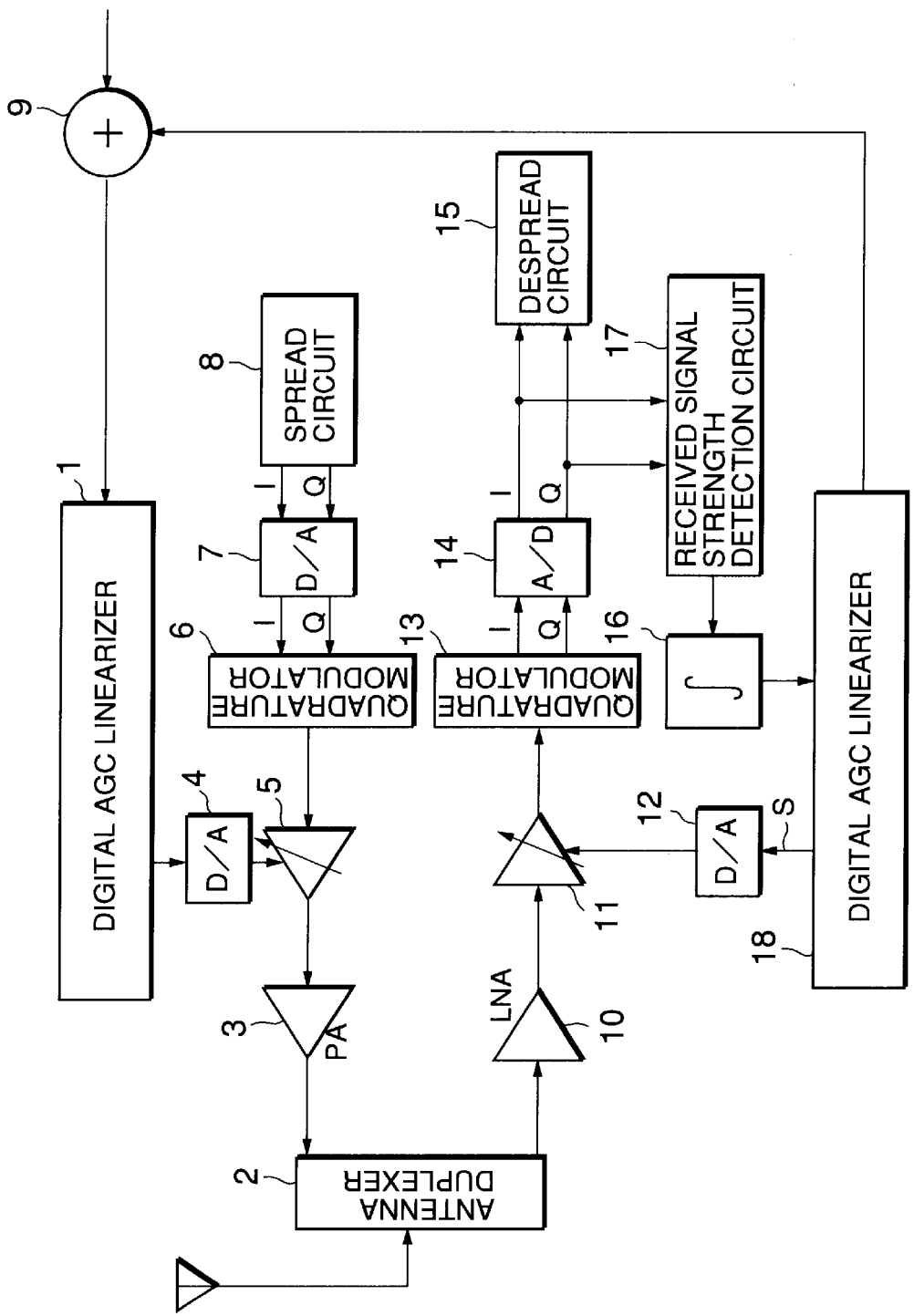
FIG. 1 is a block diagram showing the schematic whole arrangement of a digital AGC linearizer according to the first embodiment of the present invention.

Several preferred embodiments of the present invention will be described below with reference to the accompanying drawings. Note that the same reference numerals denote parts having the same functions and operations throughout the drawings.

FIG. 1 is a block diagram showing the schematic whole arrangement of a digital AGC linearizer according to the first embodiment of the present invention. This linearizer is applied to a CDMA mobile communication terminal. In FIG. 1, a signal from a base station (not shown) is input to an LNA 10 via an antenna duplexer 2. The received signal amplified by the LNA 10 is input to a receive AGC element 11. The AGC element 11 is controlled by an output from a reception digital AGC linearizer 18. The signal from the receive AGC element 11 is input to a quadrature demodulator 13 to obtain signal components, i.e., I and Q signals. The I and Q signals are converted into digital signals by an A/D converter 14. The converted I and Q signals are input to a despread circuit 15 and also to a received signal strength detection circuit 17.

The received signal strength detection circuit 17 averages the sum of squares of the digital orthogonal signals (I and Q signals) for a predetermined time. An output after the average time is sent to an integration circuit 16.

For the mobile communication terminal, reductions in size and power consumption are important factors. To suppress the chip area upon LSI integration, the use of a multiplier which increases power consumption must be avoided. The first embodiment therefore approximates the sum of squares by a simple absolute value circuit and magnitude comparator in the received signal strength detection circuit 17.

The integration circuit 16 compares the output with a reference value as desired power to generate an error signal. Then, the integration circuit 16 integrates the error signal using an accumulator. In the prior art, this integral result is directly used as a control voltage for the receive AGC element. Integration by the integration circuit 16 on a closed control loop functions as a loop filter. The receive AGC element 11 is controlled to make the obtained power coincide with the desired power.

In digital demodulation for converting the received signal by the A/D converter 14, the linearity of the AGC amplifier must be kept substantially over the dynamic range in order to optimize the S/N ratio (Signal/Noise ratio). This means that the AGC amplifier must be able to operate over the whole dynamic range. If, therefore, the linearity of the AGC amplifier is low, a proper level diagram cannot be set. To prevent this, the digital AGC linearizer 18 of the present invention is inserted between the integration circuit 16 and AGC element 11 to maintain the linearity.

The output of the reception digital AGC linearizer 18 is connected to a D/A converter 12. The D/A converter 12 converts a digital control signal for the receive AGC into an analog control signal. The converted analog signal is input to the control terminal of the receive AGC element 11 to control the gain of the AGC amplifier 10.

As is well known, the transmit AGC method of CDMA includes open-loop power control and closed-loop power control based on a command from the base station. A transmission signal having a band widened by a spread circuit 8 is converted into an analog signal by a D/A converter 7. After the transmission power is controlled by a transmit AGC element 5 via a quadrature modulator 6, the transmission signal is sent to a power amplifier 3. The output of the power amplifier 3 is connected to the antenna duplexer 2.

In the CDMA mobile terminal, the transmission power is determined on the basis of estimation at only the terminal in open-loop control, and on the basis of a command from a connected base station in closed-loop control. In open-loop estimation at only the terminal, the strength of the signal received from the base station is detected, uplink and downlink radio channels are regarded to be in the same state, and both the receive and transmit AGCs are kept at desired operation points by the same controlled variable.

However, since the AGC actually has a wide operation range of 80 dB to 90 dB, the linearity in dB conversion is lost to generate an error. As a result, an error occurs in transmission power level in open-loop control. To prevent this, a digital AGC linearizer 1 of the first embodiment is inserted between the transmit AGC element 5 and integration circuit 16 to maintain the linearity.

In FIG. 1, a signal line is connected to an adder 9 from not the integration circuit 16 but the reception linearizer 18. This signal line directly transmits an output from the integration circuit 16 to the adder 9. The adder 9 controls power on the basis of a command from the base station in closed-loop control.

Hence, the digital AGC linearizer of the present invention can make the control signal level proportional to the gain of the receive AGC amplifier for maintaining desired reception power in dB. In other words, the digital AGC linearizer compensates for nonlinearity of the AGC amplifier.

The output of the transmission digital AGC linearizer 1 is connected to a D/A converter 4. The D/A converter 4 converts a digital control signal for the transmit AGC into an analog control signal. The converted analog signal is input to the control terminal of the transmit AGC element 5 to control the gain of the AGC amplifier 3. Note that the D/A converter 4 determines a digital control signal to be converted into an analog signal upon reception of a strobe signal (not shown).

Figure 2:
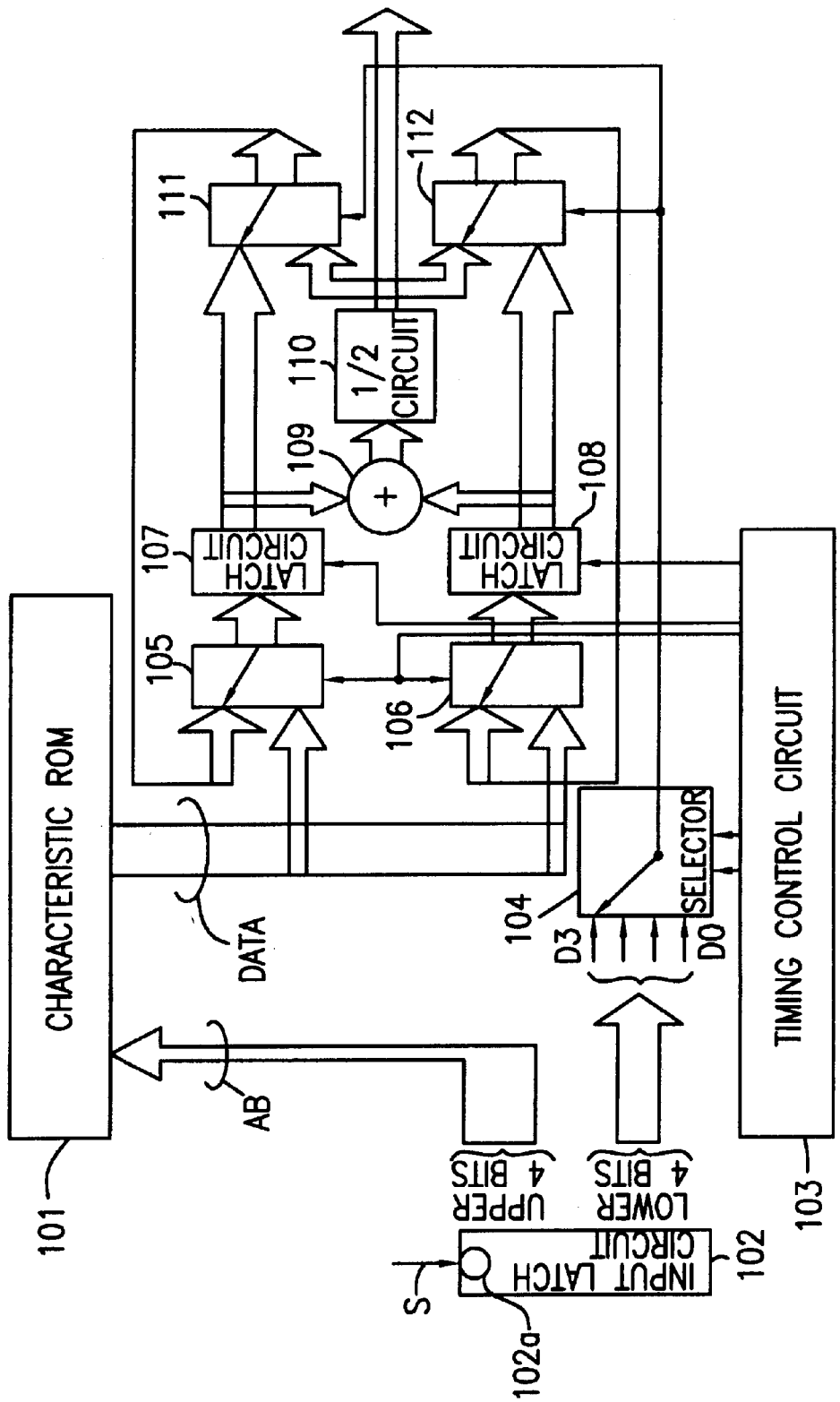
FIG. 2 is a block diagram showing the schematic internal arrangement of the AGC linearizer shown in FIG. 1.

The arrangements of the digital AGC linearizers 1 and 18 shown in FIG. 1 will be explained with reference to FIG. 2. As shown in FIG. 2, the digital AGC linearizer comprises a characteristic ROM 101 for outputting two data representing transmission characteristics in accordance with a plurality of upper bit values composing input digital data, selectors 105 and 106 corresponding with the two data, latch circuits 107 and 108 which respectively correspond with the selectors 105 and 106 and temporarily latch outputs from corresponding selectors, an adder 109 for adding outputs from the latch circuits 107 and 108, a ½ circuit 110 for calculating ½ the sum output from the adder, a selector 111 for alternatively outputting one of outputs from the ½ circuit 110 and latch circuit 107, and a selector 112 for alternatively outputting one of outputs from the ½ circuit 110 and latch circuit 108.

The characteristic ROM 101 outputs upper and lower limit data respectively corresponding to the upper and lower limits of a binary data range which can be expressed by a plurality of upper bits (e.g., 4 bits) composing digital data. A plurality of data representing transmission and reception characteristics stored in the characteristic ROM 101 are obtained by measuring controlled variables for a plurality of desired gain inputs at a predetermined interval.

The selectors 111 and 112 are controlled based on a plurality of lower bits composing input digital data.

Figure 3:
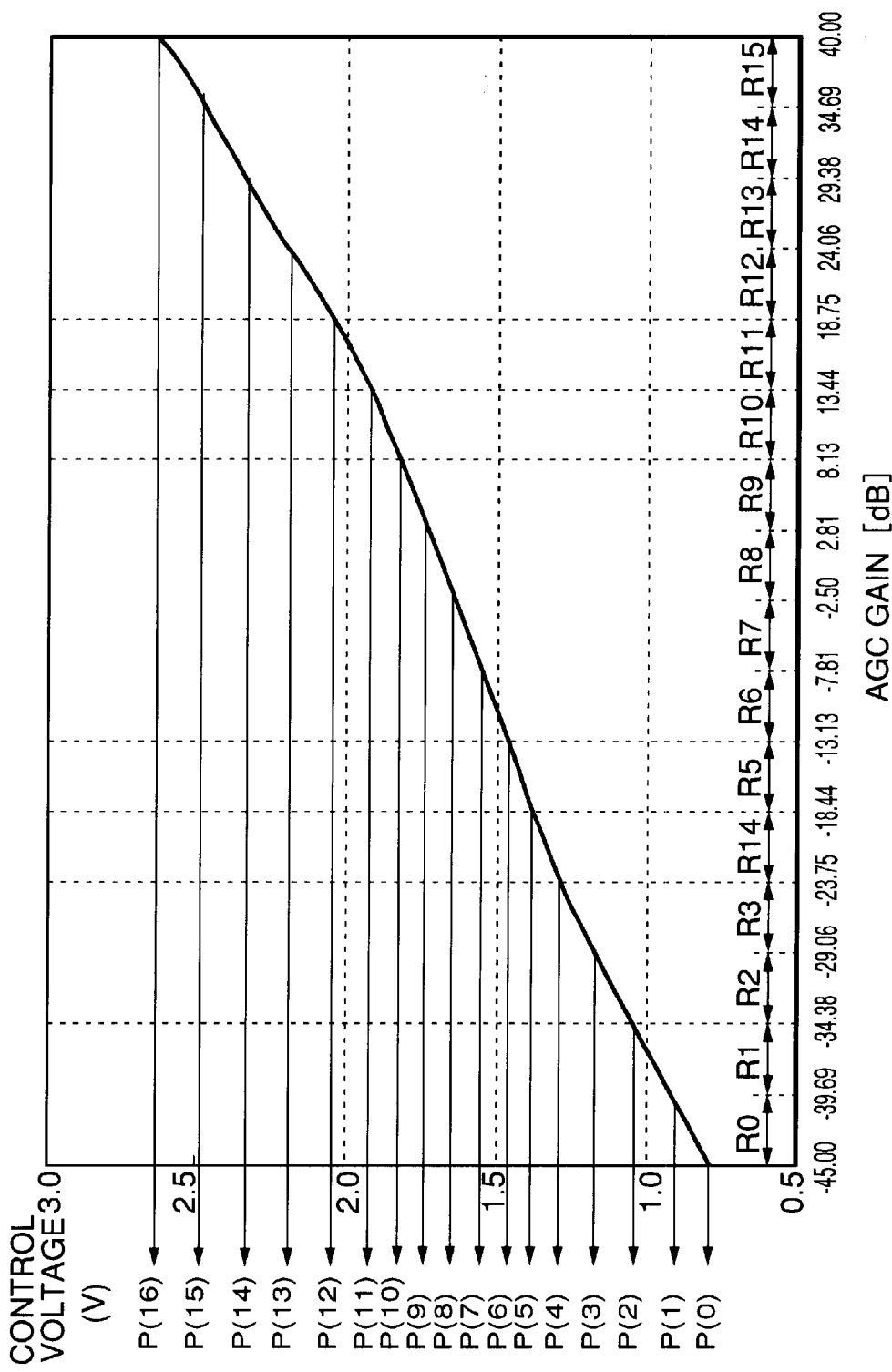
FIG. 3 is a diagram showing the relationship between the AGC control voltage and AGC gain in the first embodiment of the present invention.

Operation of the digital AGC linearizer of the present invention will be explained with reference to FIG. 2. AGC control signals output from the integration circuit 16 shown in FIG. 1 are input to gain-control-bit-assigned portions 102a of an input latch circuit 102. Upper 4 bits of data input to the latch circuit 102 are output to an address bus AB of the characteristic ROM 101, whereas their lower 4 bits are output to a selector 104. In the first embodiment, the gain of the AGC amplifier is expressed by an 8-bit straight binary code. Since the necessary dynamic range is 80 dB or more, the gain is set to For "00000000", −45 dB For "11111111", +40 dB FIG. 3 shows the relationship between the AGC control voltage and AGC gain (dB) in the first embodiment. The first embodiment adopts an 85-dB dynamic range from −45 dB to +45 dB in 256 steps from "00000000" to "11111111". Therefore, 1 dB corresponds to $$256/85 = 3[\text{step}/\text{dB}] \qquad (3)$$

In other words, 3 steps substantially correspond to 1 dB. Note that equation (1) is approximately established.

For interpolation as shown in FIG. 3, the dynamic range from −45 to +45 dB is divided into 16 regions. The divided regions R0 to R15 are made to correspond to an upper-4-bit value n of gain control data. Further, control voltages corresponding to the lower upper limits of the regions R0 to R15 are measured and stored in the characteristic ROM 101.

For example, in the region R0 (upper 4 bits of gain control data is "0000") in FIG. 3, the lower and upper limits of the control voltage are P(0) and P(1), respectively. In the region R10 (upper 4 bits of gain control data is "1010"), the lower and upper limits of the control voltage are P(10) and P(11), respectively. In general, in the region Rn, the lower and upper limits of the control voltage are P(n) and P(n+1), respectively. Note that the control voltage P(n) indicates input digital data of the D/A converter corresponding to an analog voltage generated by the D/A converter. This value is stored in the characteristic ROM 101.

The upper 4 bits of the gain control data are input as an address to the characteristic ROM 101 to determine the region n out of the 16 divided regions. The control data P(n) and p(n+1) as the lower and upper limits of this region are read out from the ROM 101 via a data bus DATA.

Referring back to FIG. 2, when the control data P(n) and P(n+1) are read out from the characteristic ROM 101 by a timing control circuit 103, the upper and lower limit data P(n+1) and P(n) are temporarily stored in the latch circuits 107 and 108, respectively, because the selectors 105 and 106 select the data bus DATA. After the lower and upper limit data are read out from the characteristic ROM 101, the selector 104 sequentially switches an internal switch to data D3 to D0 one by one by a shift circuit (not shown).

At this time, the selector 111 selects an output from the latch circuit 107 for a control bit of "1" out of the lower bits of an input to the linearizer, and an output from the ½ circuit 110 for a control bit of "0". The selector 112 selects an output from the latch circuit 108 for a control bit of "0" out of the lower bits of an input to the linearizer, and an output from the ½ circuit 110 for a control bit of "0". The control bit sequentially shifts from the MSB (Most Significant Bit) to LSB (Least Significant Bit) of the lower bits of a linearizer input. By sequentially performing this selection control, the linearizer output is determined.

Outputs from both the latch circuits 107 and 108 are input to the adder 109. The adder 109 adds the outputs from both the latch circuits 107 and 108. The sum is input to the ½ circuit 110, which outputs ½ the sum. In other words, the adder 109 and ½ circuit 110 calculates the average of P(n+1) and P(n). The average is input to the feedback selectors 111 and 112.

Each of the selectors 111 and 112 has the other input connected to the output of the latch circuit 107 or 108 which received the value P(n+1) or P(n). Selection control signals in the selectors 111 and 112, i.e., data to be input to the selector 104 are sequentially switched between D3, D2, D1, and D0.

After temporarily reading the contents P(n+1) and P(n) of the characteristic ROM 101, the selectors 105 and 106 are respectively switched to the feedback selectors 111 and 112. Consequently, depending on the output value from the selector 104, one of the latch circuits 107 and 108 latches the previous value, and the other is updated to the average of the previous values of the two latch circuits. For D3="1", since the selectors 111 and 112 are controlled to select the circuits 107 and 110 in FIG. 2, the value of the upper limit data P(n+1) is maintained, and the lower limit data P(n) is updated to the average of P(n+1) and P(n). Similarly, D2, D1, and D0 are sequentially processed to finally obtain the result given by $$X(n,m)=P(n)+\{(m/16)+(1/32)\}\times\{P(n+1)-P(n)\} \quad (2)$$

where X(n,m) is the interpolation result and m is the lower 4-bit value of gain control data.

Figure 6:
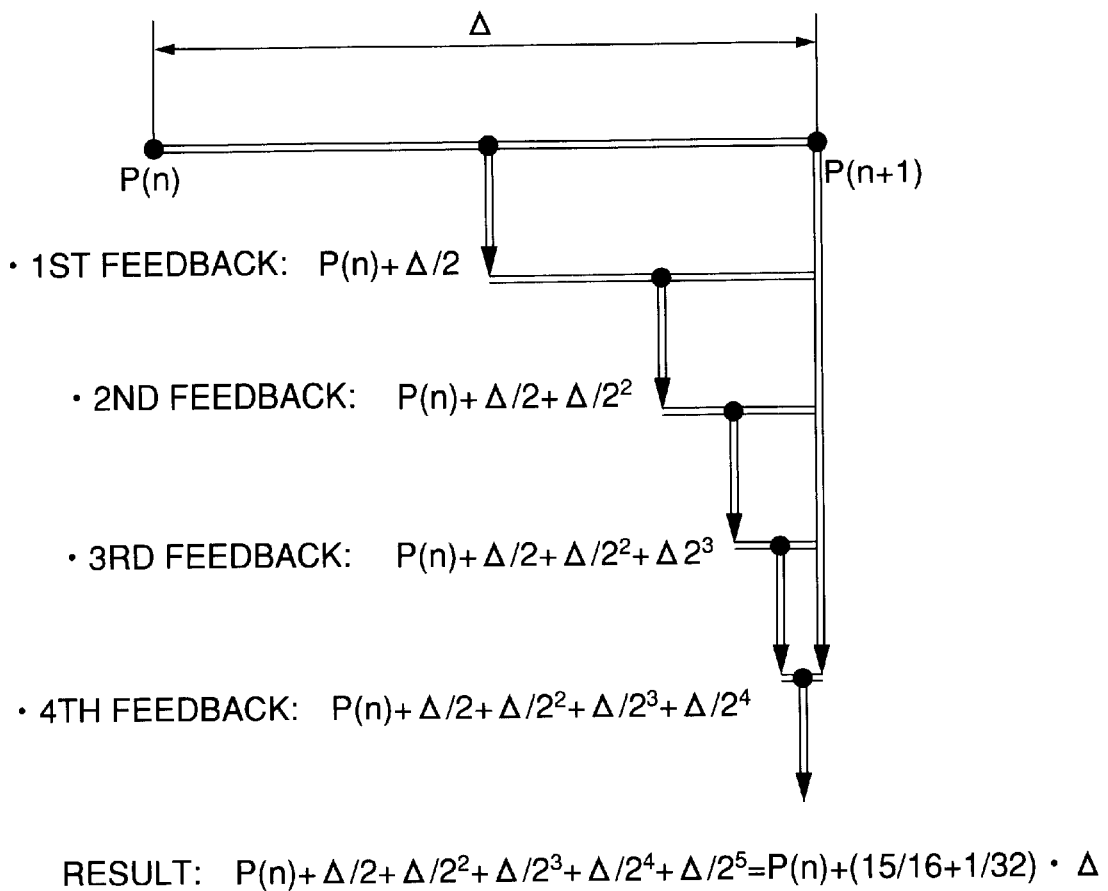
FIG. 6 is a view for explaining sequential operation of averaging for determining a linearizer output in the present invention.

Sequential processing in equation (2) will be explained with reference to FIG. 6. In this case, the lower 4-bit value of gain control data is 15, the repeat number k is 4, and the difference between input P(n) and P(n+1) is Δ. The first feedback result (k=1) is P(n)+Δ/2. The second feedback result (k=2) is P(n)+Δ/2+Δ/2². The third feedback result (k=3) is P(n)+Δ/2+Δ/2²+Δ/2³. The fourth feedback result (k=4) is P(n)+Δ/2+Δ/2²+Δ/2³+Δ/2⁴. To calculate the middle point of the minimum interval, Δ/2⁵ is added (1/32 in the first embodiment).

In general, the interpolation result $X(n,m)=P(n)+(m/2^k+\Delta/2^{k+1})\times\{P(n+1)-P(n)\}$ holds. In the first embodiment, $P(n)+\Delta/2+\Delta/2^2+\Delta/2^3+\Delta/2^4+\Delta/2^5=P(n)+(15/16+1/32)\times\Delta$. Note that as 1/32 is used to calculate the middle point of the minimum interval, it need not always be added.

As described above, the digital AGC linearizer of the first embodiment can be realized by only a simple adder and shift circuit by repeating feedback processing without increasing the chip area upon LSI integration and without using any multiplier which increases current consumption. Therefore, this digital AGC linearizer can provide a low-power-consumption, small-circuit-scale portable terminal.

The digital AGC linearizer of the present invention can provide an AGC amplifier having high-precision linearity over a wide dynamic range, and thus can provide a mobile terminal suitable for even a CDMA system in which power control greatly influences the system capacity. Further, the digital AGC linearizer of the present invention can attain high-precision linearity over a wide range even with a low-cost, low-linearity, low-quality variable gain element, and can provide an AGC amplifier suitable for a portable telephone terminal in consideration of cost reduction.

Moreover, the digital AGC linearizer of the present invention can perform linear control with high precision over a wide range even with a low-linearity, low-power-consumption variable gain element, and can realize a portable telephone terminal suitable for a long use time and low power consumption.

The second embodiment of the present invention will be described with reference to FIGS. 4 and 5. The second embodiment is a modification when change in the characteristics of the variable gain element depending on the operating temperature is considered.

In general, the characteristics of the variable gain element greatly change depending on temperature and also on the frequency band of a target signal. If, therefore, the frequency band of a signal passing through the AGC is different between transmission and reception, temperature correction must be individually done.

Figure 4:
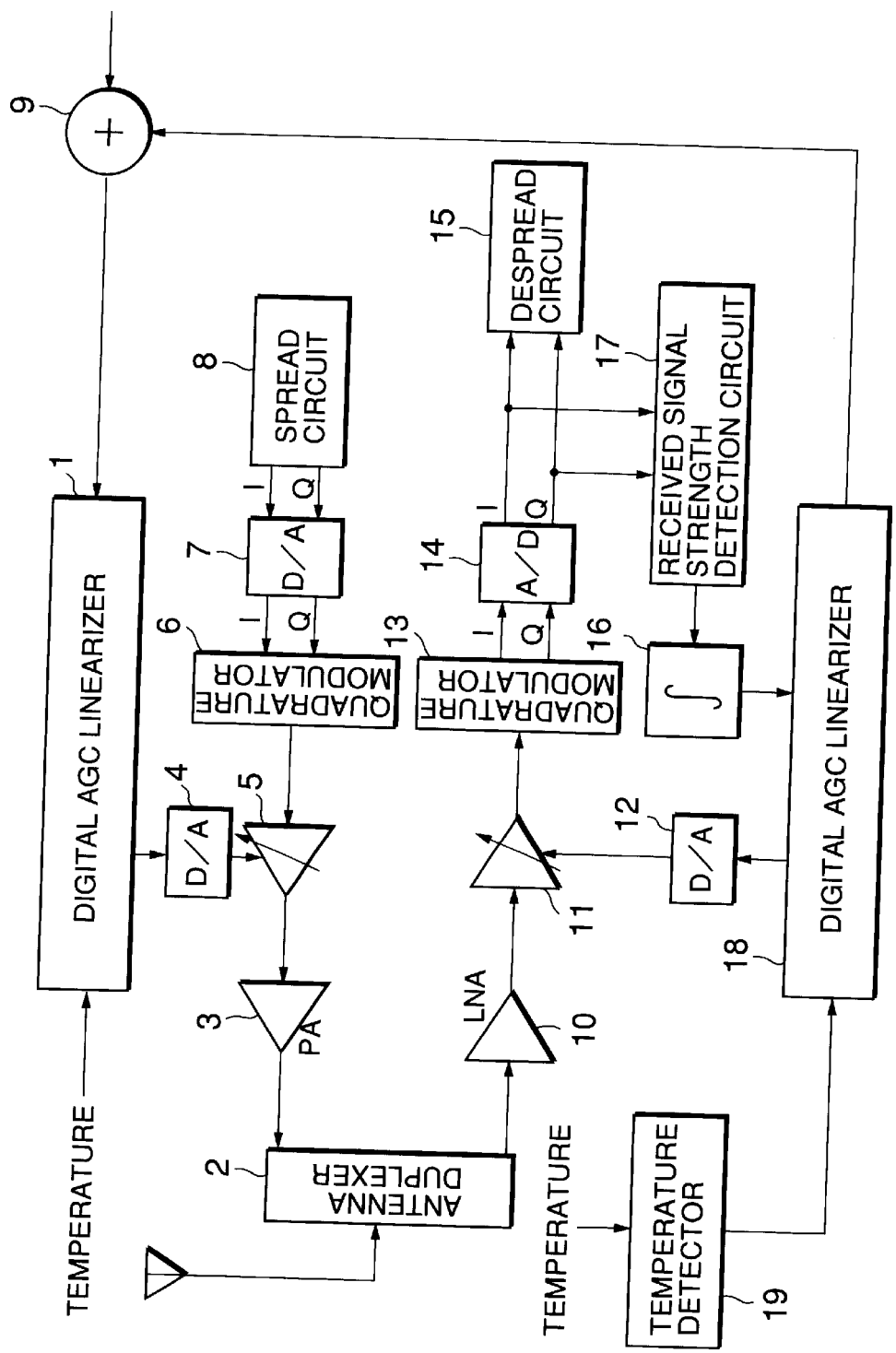
FIG. 4 is a block diagram showing the schematic whole arrangement of a digital AGC linearizer according to the second embodiment of the present invention.

FIG. 4 shows a temperature detector 19 added to the arrangement shown in FIG. 1. In FIG. 4, temperature information output from the temperature detector 19 is input to reception and transmission digital AGC linearizers 18 and 1.

Figure 5:
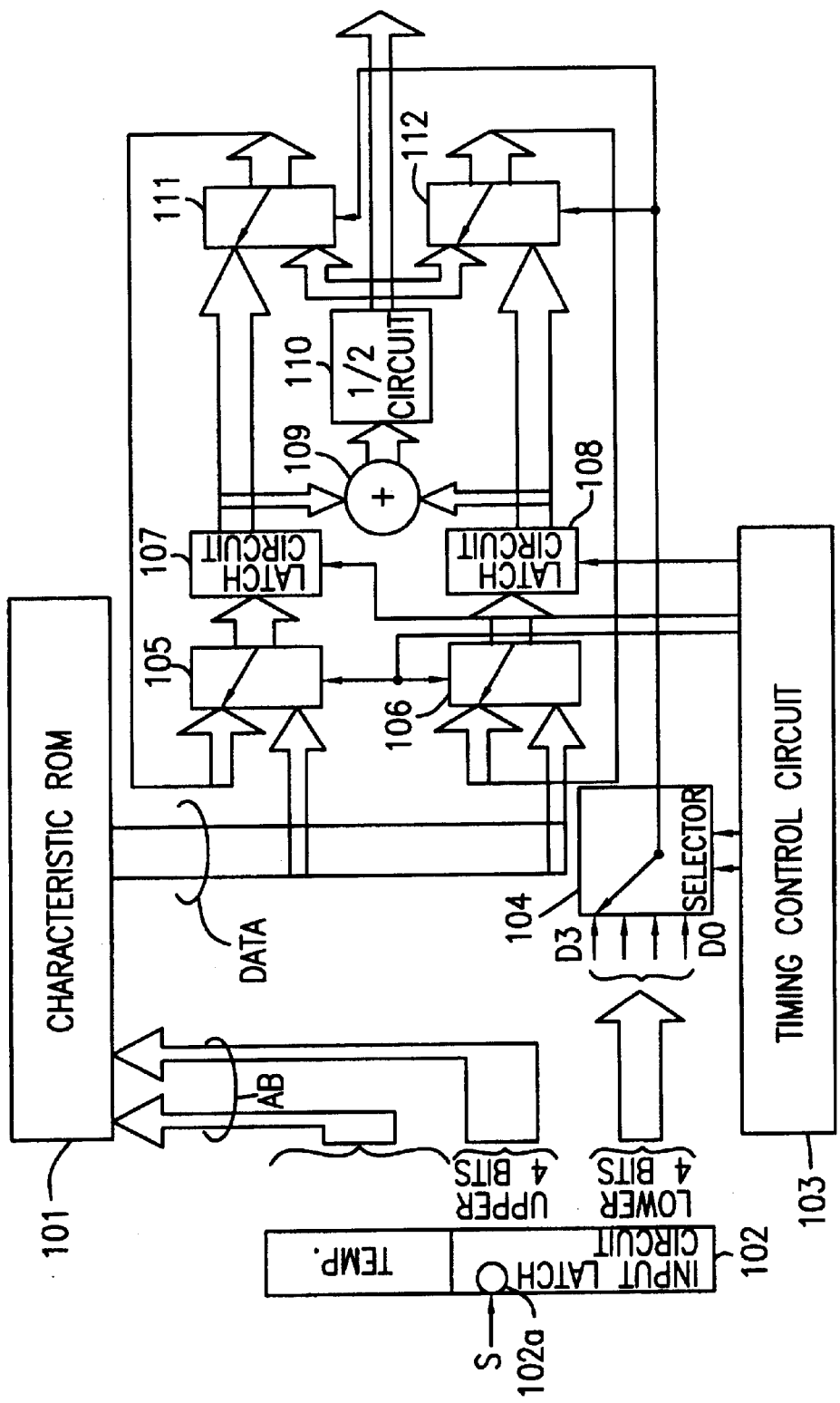
FIG. 5 is a block diagram showing the schematic internal arrangement of the AGC linearizer shown in FIG. 4.

FIG. 5 shows detailed processing of the input temperature information. The temperature information is temporarily latched by a latch circuit 102 and then mapped as an upper address of an address bus AB for a characteristic ROM 101. The lower address of the address bus AB for the characteristic ROM 101 is gain control data, similar to processing in FIG. 2.

Similar to the first embodiment, control voltage measurement data for realizing the gains of the lower and upper limits of 16 divided regions are stored in advance in the characteristic ROM 101 in accordance with the respective temperature conditions. A plurality of data representing transmission and reception characteristics that are stored in the characteristic ROM 101 are obtained by measuring a plurality of temperature conditions at a predetermined interval and controlled variables for a plurality of desired gain inputs at a predetermined interval. By supplying the upper and lower addresses of the address bus AB to the characteristic ROM 101, interpolation data corresponding to the temperature is output, similar to the first embodiment.

The output interpolation data is converted into an analog voltage value by each of D/A converters 12 and 4 to control each of AGC amplifiers 11 and 5 using the converted analog voltage value. Note that the reception and transmission digital AGC linearizers 18 and 1 are constituted by identical circuits except for the memory contents of the characteristic ROMs.

As described above, similar to the first embodiment, the digital AGC linearizer of the second embodiment can be realized by only a simple adder and shift circuit without increasing the chip area upon LSI integration and without using any multiplier which increases current consumption. Therefore, this digital AGC linearizer can provide a low-power-consumption, small-circuit-scale portable terminal. Even if the characteristics of the variable gain element change depending on the operating temperature, the second embodiment can perform linear control with high precision over a wide range to realize a portable telephone terminal suitable for a long use time and low power consumption.

Especially in a CDMA system, power control greatly influences the system capacity. The present invention can realize an AGC amplifier with high linearity precision which is an important factor for maximizing the system performance.

The present invention can attain high-precision linearity over a wide dynamic range even with a low-cost, low-linearity, low-quality variable gain element, and thus can realize an AGC amplifier suitable for a portable telephone terminal in consideration of cost reduction.

The present invention can perform linear control with high precision over a wide range even with a low-power-consumption variable gain element which generally has low linearity, and can realize a digital AGC linearizer having high-precision linearity over a wide dynamic range and a digital AGC circuit using the same in AGC circuits adopted in the radio field such as portable telephone terminals suitable for a long use time and low power consumption.

What is claimed is:

1. A digital automatic gain control linearizer for controlling a variable gain control element for automatically controlling a gain, using an analog signal obtained by converting input digital data, comprising:
   a memory for outputting upper and lower limit data of a binary data range which can be expressed by a plurality of upper bits forming the input digital data; and
   an average calculator, said average calculator calculating an average of the upper and lower limit data, and repeating the average calculation a predetermined number of times using the calculated average as at least one of the upper limit data and the lower limit data, wherein the predetermined number of times corresponds to a lower-bit value of the input digital data and wherein the variable gain control element is controlled in accordance with the calculated average.

2. A linearizer according to claim 1, wherein the variable gain control element is controlled in accordance with a conversion result obtained by converting the calculated average into an analog signal.

3. A linearizer according to claim 2, wherein the input digital data is data corresponding to a gain to be controlled.

4. A linearizer according to claim 2, wherein the input digital data is data corresponding to an ambient temperature.

5. A digital automatic gain control circuit comprising an automatic gain control loop including a variable gain control element having a reception gain controlled by said digital automatic gain control linearizer defined in claim 2.

6. A circuit according to claim 5, wherein said automatic gain control loop comprises a loop filter, and an output from said filter is input to said digital automatic gain control linearizer.

7. A circuit according to claim 6, wherein said loop filter is an integrator.

8. A circuit according to claim 5, wherein despread processing is performed for a received signal having a gain controlled by said variable gain control element.

9. A digital automatic gain control circuit comprising an automatic gain control loop including a variable gain control element having a transmission gain controlled by said digital automatic gain control linearizer defined in claim 2.

10. A circuit according to claim 9, wherein said automatic gain control loop comprises a loop filter, and an output from said filter is input to said digital automatic gain control linearizer.

11. A circuit according to claim 9, wherein despread processing is performed for a signal to be transmitted, and then the gain is controlled by said variable gain control element.

12. A circuit according to claim 10, wherein said loop filter is an integrator.

13. A linearizer according to claim 1, wherein said average calculator comprises:
    a first and second latch circuits;
    an adder for adding latch outputs from said latch circuits;
    ½ calculation means for calculating ½ an output from said adder;
    a first selector for alternatively inputting one of the calculation result and the upper limit data to said first latch circuit; and
    a second selector for alternatively inputting one of the calculation result and the lower limit data to said second latch circuit, and
    the calculation result is continuously selected in either one of said first and second selectors to repeat average calculation a predetermined number of times.

14. A linearizer according to claim 13, wherein the input digital data is data corresponding to a gain to be controlled.

15. A linearizer according to claim 13, wherein the input digital data is data corresponding to an ambient temperature.

16. A digital automatic gain control circuit comprising an automatic gain control loop including a variable gain control element having a reception gain controlled by said digital automatic gain control linearizer defined in claim 13.

17. A circuit according to claim 16, wherein said automatic gain control loop comprises a loop filter, and an output from said filter is input to said digital automatic gain control linearizer.

18. A circuit according to claim 17, wherein said loop filter is an integrator.

19. A circuit according to claim 16, wherein despread processing is performed for a received signal having a gain controlled by said variable gain control element.

20. A digital automatic gain control circuit comprising an automatic gain control loop including a variable gain control element having a transmission gain controlled by said digital automatic gain control linearizer defined in claim 13.

21. A circuit accoarding to claim 20, wherein said automatic gain control loop comprises a loop filter, and an output from said filter is input to said digital automatic gain control linearizer.

22. A circuit according to claim 21, wherein said loop filter is an integrator.

23. A circuit according to claim 20, wherein despread processing is performed for a signal to be transmitted, and then the gain is controlled by said variable gain control element.

24. A linearizer according to claim 1, wherein the input digital data is data corresponding to a gain to be controlled.

25. A linearizer according to claim 1, wherein the input digital data is data corresponding to an ambient temperature.

26. A digital automatic gain control circuit comprising an automatic gain control loop including a variable gain control element having a reception gain controlled by said digital automatic gain control linearizer defined in claim 1.

27. A circuit according to claim 26, wherein despread processing is performed for a received signal having a gain controlled by said variable gain control element.

28. A circuit according to claim 26, wherein said automatic gain control loop comprises a loop filter, and an output from said filter is input to said digital automatic gain control linearizer.

29. A circuit according to claim 28, wherein said loop filter is an integrator.

30. A digital automatic gain control circuit comprising an automatic gain control loop including a variable gain control element having a transmission gain controlled by said digital automatic gain control linearizer defined in claim 1.

31. A circuit according to claim 30, wherein said automatic gain control loop comprises a loop filter, and an output from said filter is input to said digital automatic gain control linearizer.

32. A circuit according to claim 31, wherein said loop filter is an integrator.

33. A circuit according to claim 30, wherein despread processing is performed for a signal to be transmitted, and then the gain is controlled by said variable gain control element.

\* \* \* \* \*